(12) United States Patent
Khaleghimeybodi et al.

(10) Patent No.: US 11,561,757 B2
(45) Date of Patent: *Jan. 24, 2023

(54) METHODS AND SYSTEM FOR ADJUSTING LEVEL OF TACTILE CONTENT WHEN PRESENTING AUDIO CONTENT

(71) Applicant: Meta Platforms Technologies, LLC, Menlo Park, CA (US)

(72) Inventors: Morteza Khaleghimeybodi, Bothell, WA (US); Buye Xu, Sammamish, WA (US); Peter Gottlieb, Seattle, WA (US); Scott Porter, Woodinville, WA (US); Antonio John Miller, Woodinville, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 128 days.

This patent is subject to a terminal disclaimer.

(21) Appl. No.: 17/021,189

(22) Filed: Sep. 15, 2020

(65) Prior Publication Data
US 2021/0089266 A1 Mar. 25, 2021

Related U.S. Application Data

(63) Continuation of application No. 16/580,528, filed on Sep. 24, 2019, now Pat. No. 10,824,390.

(51) Int. Cl.
*G06F 3/16* (2006.01)
*H04R 1/10* (2006.01)
*H04R 29/00* (2006.01)

(52) U.S. Cl.
CPC .......... *G06F 3/165* (2013.01); *H04R 1/1016* (2013.01); *H04R 29/002* (2013.01); *H04R 2400/03* (2013.01); *H04R 2460/13* (2013.01)

(58) Field of Classification Search
CPC ... G10L 19/018; G10L 19/02; G10L 19/0212; G10L 19/002; G10L 19/005; G10L 19/04; G10L 19/08; G10L 19/083; G10L 19/12; G10L 19/125; G10L 19/20; G10L 19/24; G10L 19/26; G10L 21/0364; G10L 25/21;
(Continued)

(56) References Cited

U.S. PATENT DOCUMENTS 9,722,562 B1   8/2017   Seguin
10,070,224 B1  9/2018   Miller
(Continued)

FOREIGN PATENT DOCUMENTS

EP       3445066 A1     2/2019
WO   WO 2019/157443 A1  8/2019

OTHER PUBLICATIONS

United States Office Action, U.S. Appl. No. 16/580,544, dated Jun. 26, 2020, 17 pages.
(Continued)

*Primary Examiner* — Lun-See Lao
(74) *Attorney, Agent, or Firm* — Fenwick & West LLP

(57) ABSTRACT

An audio system presented herein includes a transducer array, a sensor array, and a controller. The transducer array presents audio content to a user. The controller controls the transducer array to adjust a level of tactile content imparted to the user via actuation of at least one transducer in the transducer array while presenting the audio content to the user. The audio system can be part of a headset.

20 Claims, 7 Drawing Sheets

(58) Field of Classification Search
CPC ..... G10L 25/93; G10L 19/022; G10L 19/025; G10L 2021/0135; G10L 21/003; G10L 21/02; G10L 21/0208; G10L 21/04; G10L 25/15; G10L 25/24; H04R 1/1016; H04R 2400/03; H04R 2460/13; H04R 29/002; H04R 2225/43; H04R 3/04; H04R 5/033; H04R 1/24; H04R 1/403; H04R 1/406; H04R 2430/03; H04R 2499/13; H04R 25/353; H04R 25/40; H04R 25/606; H04R 25/70; H04R 3/005; H04R 3/12; H04R 3/14; H04R 5/02; H04R 5/04; G10H 1/125; G10H 2240/056; G10H 2250/061; G10H 2250/121; G10H 1/12; G10H 1/20; G10H 1/383; G10H 1/44; G10H 2210/205; G10H 2210/225; G10H 2210/281; G10H 2210/305; G10H 2210/335; G10H 2210/471; G10H 2210/581; G10H 2210/586; G10H 2210/596; G10H 2210/601; G10H 2210/621; G10H 2210/626; G10H 2240/145; G10H 2250/105; G10H 2250/161; G10H 3/125; G10H 3/186; G10H 7/02; H04S 1/002; H04S 2400/13; H04S 2420/07; H04S 7/304; H04S 1/00; H04S 1/005; H04S 2400/11; H04S 2400/15; H04S 2420/01; H04S 3/00; H04S 3/008; H04S 7/301; A61B 5/11; A61B 5/12; A61B 5/6803; H04B 1/665; H04B 1/707; H04B 15/00; H04B 15/04; H04L 5/1438; H04L 5/16; H04M 11/062; H04N 2005/91335; H04N 21/2543; H04N 21/262; H04N 21/44204; H04N 21/6143; H04N 21/63345; H04N 21/8106; H04N 21/8355; H04N 21/8358; H04N 5/332; H04N 5/76; H04N 5/913; H04N 7/165; H04N 9/8211
USPC ...................................................... 381/56–58
See application file for complete search history.

(56) References Cited

U.S. PATENT DOCUMENTS

| | | | |
|---|---|---|---|
| 10,231,053 | B1 | 3/2019 | Mehra et al. |
| 10,356,231 | B2 | 7/2019 | Hosoi et al. |
| 10,645,520 | B1 | 5/2020 | Amengual Gari et al. |
| 10,824,390 | B1* | 11/2020 | Khaleghimeybodi ....................... H03G 5/165 |
| 2007/0041595 | A1 | 2/2007 | Carazo et al. |
| 2012/0245721 | A1 | 9/2012 | Story et al. |
| 2012/0300956 | A1 | 11/2012 | Horii |
| 2013/0051271 | A1* | 2/2013 | Cao ..................... H04L 43/0852 370/252 |
| 2014/0146243 | A1 | 5/2014 | Liu et al. |
| 2014/0363002 | A1 | 12/2014 | Kupershmidt et al. |
| 2014/0363003 | A1 | 12/2014 | Kupershmidt et al. |
| 2014/0363033 | A1 | 12/2014 | Heiman et al. |
| 2015/0312676 | A1* | 10/2015 | Ekstrand ............... G10L 21/038 381/98 |
| 2017/0006387 | A1* | 1/2017 | Kah, Jr. ................. H04R 25/02 |
| 2017/0374470 | A1 | 12/2017 | Asfaw |
| 2018/0152786 | A1 | 5/2018 | Moeller et al. |
| 2018/0164588 | A1* | 6/2018 | Leppanen ............ G02B 27/017 |
| 2018/0329482 | A1 | 11/2018 | Woo et al. |
| 2019/0268712 | A1 | 8/2019 | Martin et al. |
| 2019/0378385 | A1* | 12/2019 | Biggs ................... H04R 1/1091 |
| 2019/0379940 | A1 | 12/2019 | Bentovim et al. |
| 2020/0258700 | A1 | 8/2020 | Willis |

OTHER PUBLICATIONS

United States Office Action, U.S. Appl. No. 16/580,544, dated Oct. 14, 2020, 25 pages.
PCT International Search Report and Written Opinion, PCT Application No. PCT/US2020/045543, dated Nov. 16, 2020, 10 pages.
PCT International Search Report and Written Opinion, PCT Application No. PCT/US2020/049603, dated Nov. 13, 2020, nine pages.
International Preliminary Report on Patentability for International Application No. PCT/US2020/045543, dated Apr. 7, 2022, 9 pages.
International Preliminary Report on Patentability for International Application No. PCT/US2020/049603, dated Apr. 7, 2022, 7 pages.

* cited by examiner

400

Determine an amount of tactile content to be imparted to a user via actuation of at least one transducer in an array of transducers while presenting audio content to the user
410

Instruct the array of transducers to present the audio content to the user, wherein the audio content includes the determined amount of tactile content
420

METHODS AND SYSTEM FOR ADJUSTING LEVEL OF TACTILE CONTENT WHEN PRESENTING AUDIO CONTENT

CROSS REFERENCE TO RELATED APPLICATIONS

This application is a continuation of U.S. application Ser. No. 16/580,528, filed Sep. 24, 2019, which is incorporated by reference in its entirety.

FIELD OF THE INVENTION

This disclosure relates generally to artificial reality systems, and more specifically to an audio system configured to adjust a level of tactile content when presenting audio content in artificial reality systems.

BACKGROUND

Head-mounted displays in artificial reality systems often include features such as speakers or personal audio devices to provide audio content to users of the head-mounted displays. In some instances, conventional head-mounted display may use bone conduction and/or cartilage conduction to provide audio content to the user. However, at certain frequencies and amplitudes in addition to hearing the audio content, the audio content may be perceived by the user (e.g., via mechanoreceptors embedded in tissues) as tactile stimulation.

SUMMARY

Embodiments of the present disclosure support an audio system, a method, and a computer readable medium for providing content to a user, e.g., wearer of a headset. The audio system includes a transducer array configured to present the content to the user. The audio system further includes a controller configured to control the transducer array to adjust a level of tactile content imparted to the user via actuation of at least one transducer in the transducer array while presenting audio content to the user. The audio system can be integrated as part of the headset.

Figure 1A:
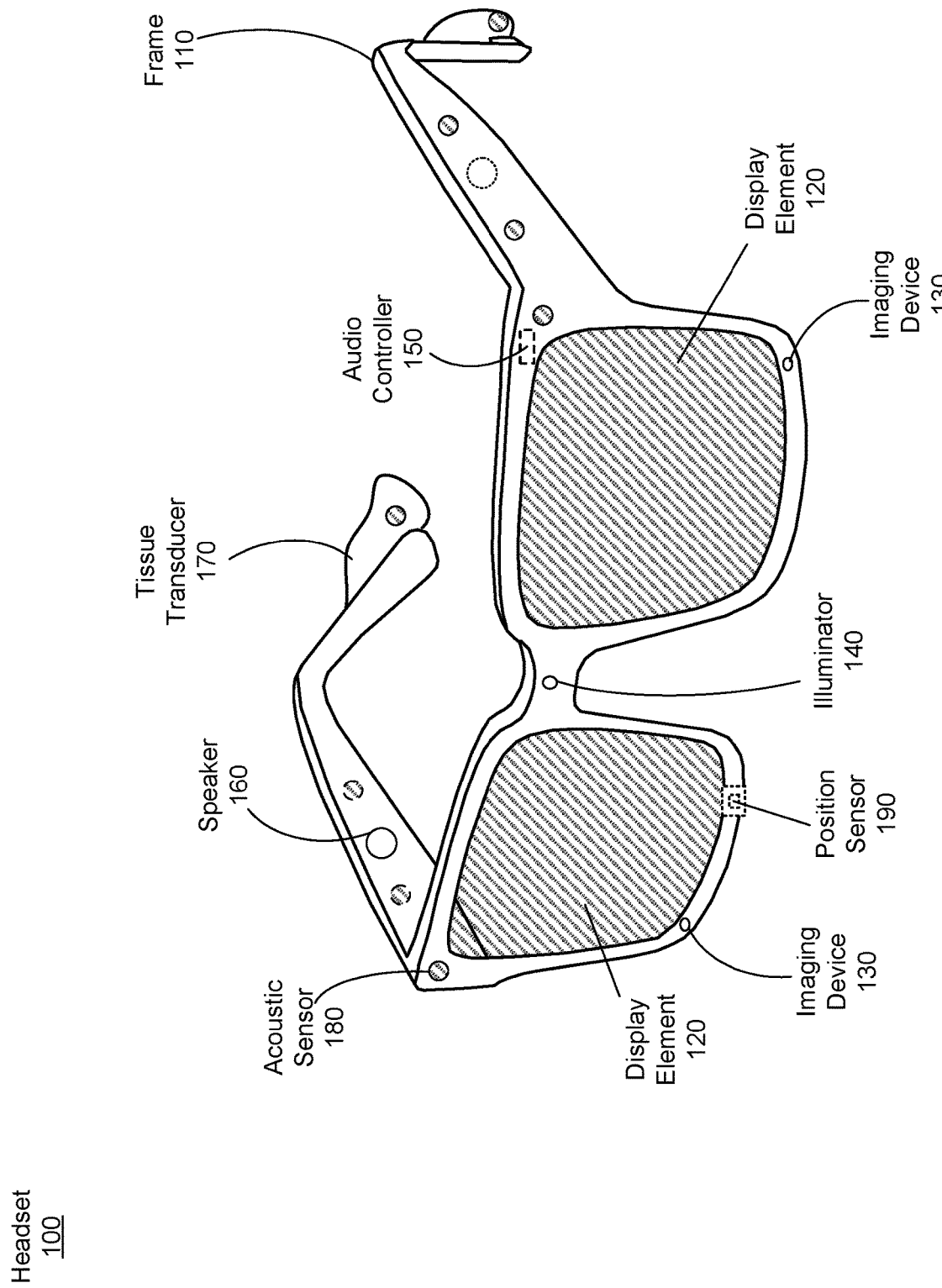
FIG. 1A is a perspective view of a headset implemented as an eyewear device, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

A transducer placed in a proximity of an outer ear can create (e.g., by exciting a certain tissue) acoustic pressure waves inside an ear-canal that can be perceived by a person as sound. At certain frequencies when excitation levels increase, the person (e.g., via mechanoreceptors embedded in tissues) may start sensing tactile sensations (i.e., sense of touch). Embodiments of the present disclosure relate to an audio system that controls and adjust a level of tactile content presented to a user of the audio system.

An audio system for controlling a modality (i.e., audio only, tactile only or combination of audio/tactile) of presented content is enclosed herein. The audio system includes a transducer array, a sensor array, and an audio controller. The transducer array presents content to a user via, e.g., cartilage conduction, bone conduction, air conduction, or some combination thereof. The sensor array detects sounds produced by the transducer array. The sensor array may include at least one acoustic sensor and/or at least one vibration sensor (i.e., an accelerometer). The audio controller may control, based on the detected sounds, the transducer array to adjust a level of tactile feedback that may be imparted to the user via actuation of one or more transducers in the transducer array while presenting content. In some embodiments, the audio controller adjusts the level of tactile feedback such that the user does not perceive any tactile content. The audio controller may adjust the level of tactile feedback using, e.g., a perception model, which may be specific to the user and obtained via a calibration process. In some embodiments, the audio controller controls the transducer array to control tactile content that is imparted to the user via actuation of one or more transducers in the transducer array. In one or more embodiments, at least one transducer in the transducer array is configured to induce tissue vibrations (e.g., skin vibrations) strong enough to be felt as tactile sensation (e.g., touch). The tactile content that is intentionally controlled to be perceived by the user may be utilized for, e.g., providing navigation instructions to the user, increasing speech intelligibility, providing near field effect, some combination thereof, etc.

The audio system presented herein may be part of a headset. The headset may be, e.g., a near eye display (NED), a head-mounted display (HMD), or some other type of headset. The headset may be part of an artificial reality system. The headset further includes a display and an optical assembly. The display of the headset is configured to emit image light. The optical assembly of the headset is configured to direct the image light to an eye box of the headset corresponding to a location of a user's eye. In some embodiments, the image light may include depth information for a local area surrounding the headset. Alternatively or additionally, the audio system presented herein may operate in conjunction with a set of smart headphones having cartilage conduction actuator(s) and/or bone conduction actuator(s).

The audio system presented herein controls and adjusts a level of tactile content presented to a user of the audio system. The tactile content could be often considered a nuisance. The audio system presented herein is configured to turn the tactile content into information useful for the user.

The audio system presented herein can also be configured to mitigate the tactile content such that the tactile content is not perceived by the user.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

FIG. 1A is a perspective view of a headset 100 implemented as an eyewear device, in accordance with one or more embodiments. In some embodiments, the eyewear device is a NED. In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame, and may include, among other components, a display assembly including one or more display elements 120, a depth camera assembly (DCA), an audio system, and a position sensor 190. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated in FIG. 1A, the headset 100 includes a display element 120 for each eye of a user. In some embodiments, a display element 120 generates image light that is provided to an eyebox of the headset 100. The eyebox is a location in space that an eye of user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content.

In some embodiments, a display element 120 does not generate image light, and instead is a lens that transmits light from the local area to the eyebox. For example, one or both of the display elements 120 may be a lens without correction (non-prescription) or a prescription lens (e.g., single vision, bifocal and trifocal, or progressive) to help correct for defects in a user's eyesight. In some embodiments, the display element 120 may be polarized and/or tinted to protect the user's eyes from the sun.

Note that in some embodiments, the display element 120 may include an additional optics block (not shown). The optics block may include one or more optical elements (e.g., lens, Fresnel lens, etc.) that direct light from the display element 120 to the eyebox. The optics block may, e.g., correct for aberrations in some or all of the image content, magnify some or all of the image, or some combination thereof.

The DCA determines depth information for a portion of a local area surrounding the headset 100. The DCA includes one or more imaging devices 130 and a DCA controller (not shown in FIG. 1A), and may also include an illuminator 140. In some embodiments, the illuminator 140 illuminates a portion of the local area with light. The light may be, e.g., structured light (e.g., dot pattern, bars, etc.) in the infrared (IR), IR flash for time-of-flight, etc. In some embodiments, the one or more imaging devices 130 capture images of the portion of the local area that include the light from the illuminator 140. As illustrated, FIG. 1A shows a single illuminator 140 and two imaging devices 130. In alternate embodiments, there is no illuminator 140 and at least two imaging devices 130.

The DCA controller computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the illuminator 140), some other technique to determine depth of a scene, or some combination thereof.

The audio system provides audio content. The audio system includes a transducer array, a sensor array, and an audio controller 150. However, in other embodiments, the audio system may include different and/or additional components. Similarly, in some cases, functionality described with reference to the components of the audio system can be distributed among the components in a different manner than is described here. For example, some or all of the functions of the audio controller 150 may be performed by a remote server.

The transducer array presents sound to user. The transducer array includes a plurality of transducers. A transducer may be a speaker 160 or a tissue transducer 170 (e.g., a bone conduction transducer or a cartilage conduction transducer). As shown in FIG. 1A, the speakers 160 may be enclosed in the frame 110. In some embodiments, instead of individual speakers for each ear, the headset 100 includes a speaker array comprising multiple speakers integrated into the frame 110 to improve directionality of presented audio content, e.g., using beamforming array processing. The tissue transducer 170 couples to the head of the user and directly vibrates tissue (e.g., bone or cartilage) of the user to generate sound. The number and/or locations of transducers may be different from what is shown in FIG. 1A.

The sensor array detects sounds within the local area of the headset 100. In some embodiments, the sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

In some embodiments, one or more acoustic sensors 180 may be placed in an ear canal of each ear (e.g., acting as binaural microphones). In some embodiments, the acoustic sensors 180 may be placed on an exterior surface of the headset 100, placed on an interior surface of the headset 100, separate from the headset 100 (e.g., part of some other device), or some combination thereof. The number and/or locations of acoustic sensors 180 may be different from what is shown in FIG. 1A. For example, the number of acoustic detection locations may be increased to increase the amount of audio information collected and the sensitivity and/or accuracy of the information. The acoustic detection locations may be oriented such that the microphone is able to detect sounds in a wide range of directions surrounding the user wearing the headset 100.

In some other embodiments, the sensor array includes a plurality of vibration sensors, e.g., accelerometers. The accelerometers capture information about acceleration of vibration which is used to control and/or adjust amplitude levels of sound signals. The accelerometer may be embedded into the frame 110. Alternatively, the accelerometer may be positioned to be in contact with a tissue at a proximity of a transducer, e.g., the tissue transducer 170. Additionally, a proximity sensor can also be used to ensure that the tissue transducer 170 (e.g., the cartilage conduction transducer) is in a proper location.

The audio controller 150 processes information from the sensor array that describes sounds detected by the sensor array. The audio controller 150 may comprise a processor and a computer-readable storage medium. The audio controller 150 may be configured to generate direction of arrival (DOA) estimates, generate acoustic transfer functions (e.g., array transfer functions and/or head-related transfer functions), track the location of sound sources, form beams in the direction of sound sources, classify sound sources, generate sound filters for the speakers 160, or some combination thereof.

In some embodiments, the audio controller 150 controls the transducer array to adjust a level of tactile content imparted to the user wearing the headset 100 via actuation of at least one of the transducers (e.g., the tissue transducer 170), e.g., while presenting audio content to the user. The tactile content is generally a byproduct of the audio content, and the same transducer(s) producing the audio can also produce the tactile content. The audio controller 150 may be configured to generate content of a different modality for presentation to the user. The audio controller 150 may be configured to generate the content that is audio only, tactile only, or a combination of audio and tactile. Additionally, the audio controller 150 may be configured to mitigate both audio content and tactile content, such that no content is presented to the user.

The audio controller 150 may adjust tactile content by adjusting one or more actuation parameters of the at least one of the transducer. An actuation parameter for a transducer may be a signal (e.g., mechanical or electrical) that is used to actuate the transducer. An actuation parameter may be, e.g., a voltage, an electrical current, a mechanical pressure, some other actuation signal, or some combination thereof. The audio controller 150 may adjust an actuation parameter of the at least one transducer for a frequency band relative to a tactility threshold level. Values of the actuation parameter below the threshold level correspond to ranges of actuation where a portion of the tactile content for the frequency band is not perceived by the user, and values at or above the threshold level correspond to ranges where the portion of the tactile content is perceived by the user. The acoustic sensors 180 may detect sounds produced by the transducer array, e.g., the tissue transducer 170 and/or the speaker 160. The audio controller 150 may derive a tactility threshold level for the actuation parameter of the tissue transducer 170 for a frequency band, based on a portion of the detected sounds within the frequency band. The audio controller 150 may then adjust the actuation parameter to be below the tactility threshold level when actuating the tissue transducer 170 for presentation of a portion of the tactile content within the frequency band.

In some embodiments, the audio controller 150 controls tactile content imparted to the user wearing the headset 100 via actuation of at least one of the transducers (e.g., the tissue transducer 170) while presenting audio content to the user so that the controlled tactile content is perceived by the user at certain times. In such cases, the transducer array presents the audio content and the controlled tactile content to the user. In one or more embodiment, the audio controller 150 uses the controlled tactile content to provide navigation instructions to the user. For example, the audio controller 150 applies the tactile content to a corresponding tissue transducer 170 (e.g., a cartilage conduction transducer) attached to a corresponding ear of the user to provide the navigation instructions to the user. In another embodiment, the audio controller 150 controls the tactile content to increase speech intelligibility for the audio content presented to the user. In yet another embodiment, the audio controller 150 controls the tactile content to generate the audio content with a defined level of near field effect. Additional details about operations of the audio controller 150 and other components of the audio system are provided below in connection with FIG. 2A, FIG. 3 and FIG. 4.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room. Additional details regarding the components of the headset 100 are discussed below in connection with FIG. 5.

Figure 1B:
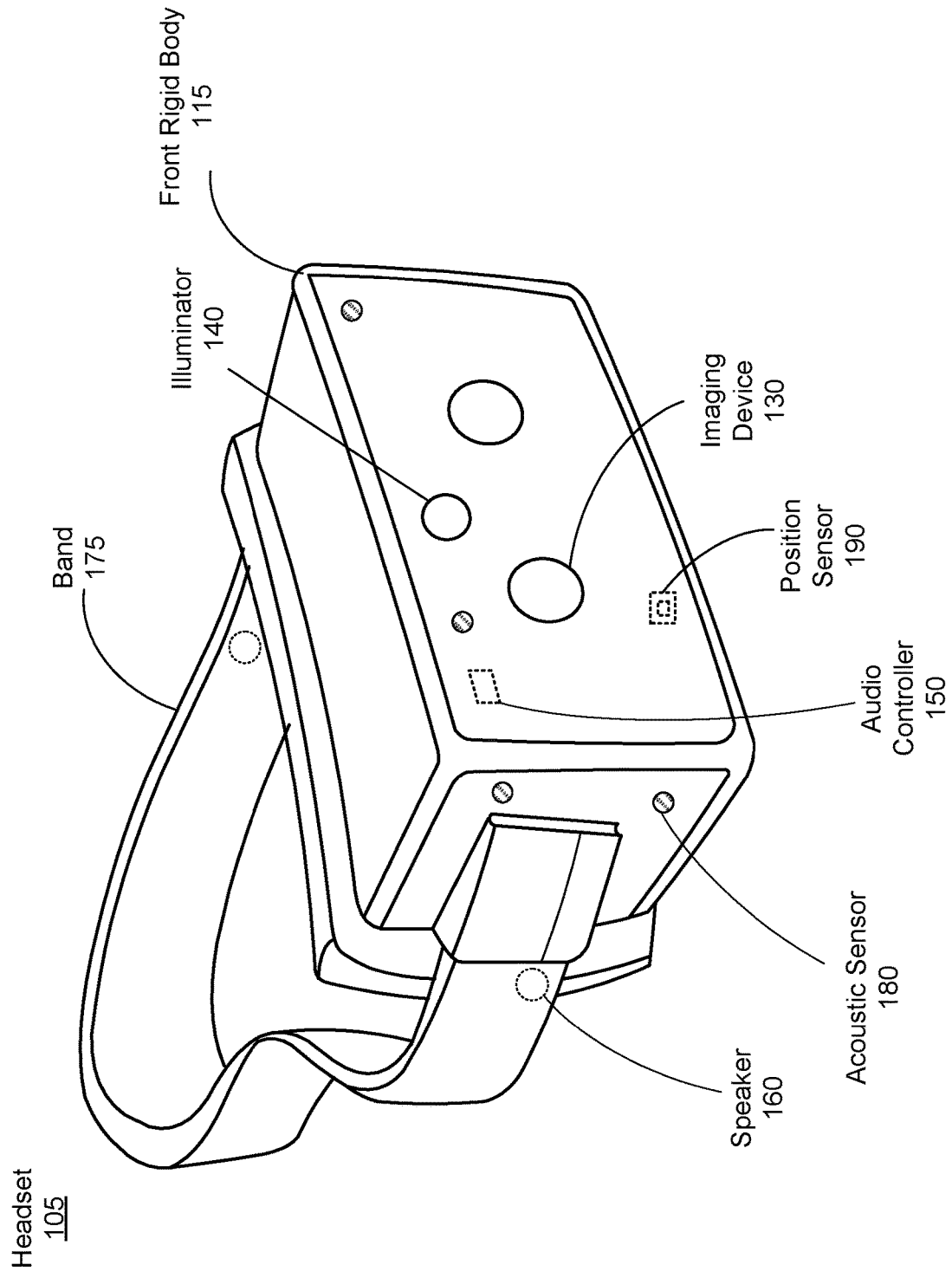
FIG. 1B is a perspective view of a headset implemented as a head-mounted display, in accordance with one or more embodiments.

FIG. 1B is a perspective view of a headset 105 implemented as a HMD, in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band 175. The headset 105 includes many of the same components described above with reference to FIG. 1A, but modified to integrate with the HMD form factor. For example, the HMD includes a display assembly, a DCA, an audio system, and a position sensor 190. FIG. 1B shows the illuminator 140, a plurality of the speakers 160, a plurality of the imaging devices 130, a plurality of the acoustic sensors 180, and the position sensor 190.

Figure 2A:
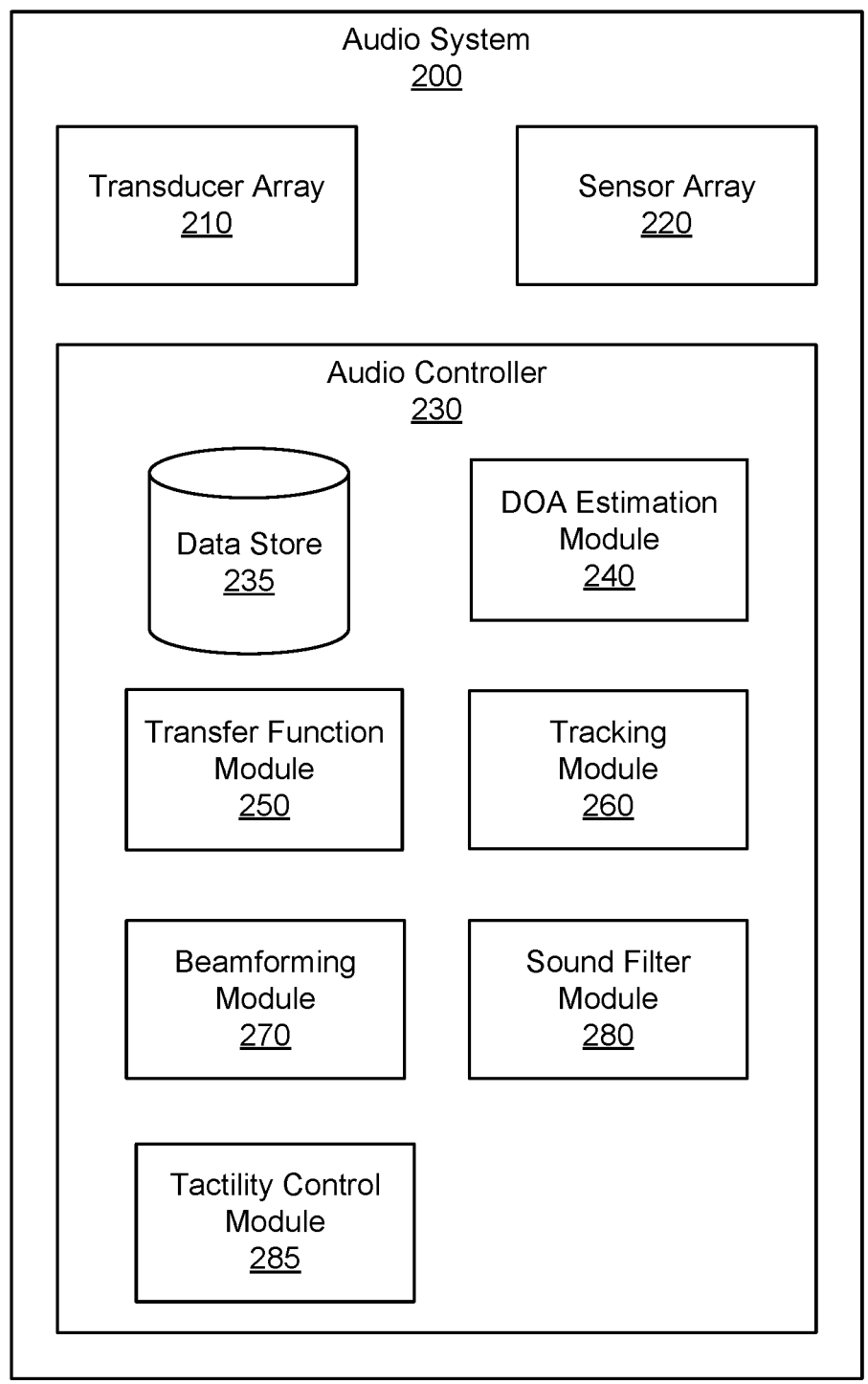
FIG. 2A is a block diagram of an audio system, in accordance with one or more embodiments.

FIG. 2A is a block diagram of an audio system 200, in accordance with one or more embodiments. The audio system in FIG. 1A or FIG. 1B may be an embodiment of the audio system 200. The audio system 200 generates one or more acoustic transfer functions for a user. The audio system 200 may then use the one or more acoustic transfer functions to generate audio content for the user. In the embodiment of FIG. 2A, the audio system 200 includes a transducer array 210, a sensor array 220, and an audio controller 230. Some embodiments of the audio system 200 have different components than those described here. Similarly, in some cases, functions can be distributed among the components in a different manner than is described here.

The transducer array 210 is configured to present content. The presented content can be audio content, tactile content, or some combination thereof. The transducer array 210 includes a plurality of transducers. A transducer is a device that provides content, e.g., audio content, tactile content, or some combination thereof. A transducer may be, e.g., a speaker (e.g., the speaker 160), a tissue transducer (e.g., the tissue transducer 170), some other device that provides content, or some combination thereof. A tissue transducer may be configured to function as a bone conduction transducer or a cartilage conduction transducer. The transducer array 210 may present content via air conduction (e.g., via one or more speakers), via bone conduction (via one or more bone conduction transducers), via cartilage conduction audio system (via one or more cartilage conduction transducers), or some combination thereof. In some embodiments, the transducer array 210 may include one or more transducers to cover different parts of a frequency range. For example, a piezoelectric transducer may be used to cover a first part of a frequency range and a moving coil transducer may be used to cover a second part of a frequency range.

The bone conduction transducers generate acoustic pressure waves by vibrating bone/tissue in the user's head. A bone conduction transducer may be coupled to a portion of a headset, and may be configured to be behind the auricle coupled to a portion of the user's skull. The bone conduction transducer receives vibration instructions from the audio controller 230, and vibrates a portion of the user's skull based on the received instructions. The vibrations from the bone conduction transducer generate a tissue-borne acoustic pressure wave that propagates toward the user's cochlea, bypassing the eardrum.

The cartilage conduction transducers generate acoustic pressure waves by vibrating one or more portions of the auricular cartilage of the ears of the user. A cartilage conduction transducer may be coupled to a portion of a headset, and may be configured to be coupled to one or more portions of the auricular cartilage of the ear. For example, the cartilage conduction transducer may couple to the back of an auricle of the ear of the user. The cartilage conduction transducer may be located anywhere along the auricular cartilage around the outer ear (e.g., the pinna, the tragus, some other portion of the auricular cartilage, or some combination thereof). Vibrating the one or more portions of auricular cartilage may generate: airborne acoustic pressure waves outside the ear canal; tissue born acoustic pressure waves that cause some portions of the ear canal to vibrate thereby generating an airborne acoustic pressure wave within the ear canal; or some combination thereof. The generated airborne acoustic pressure waves propagate down the ear canal toward the ear drum.

The transducer array 210 generates content in accordance with instructions from the audio controller 230. In some embodiments, the content is spatialized. Spatialized content is content that appears to originate from a particular direction and/or target region (e.g., an object in the local area and/or a virtual object). For example, spatialized content can make it appear that sound is originating from a virtual singer across a room from a user of the audio system 200. The transducer array 210 may be coupled to a wearable device (e.g., the headset 100 or the headset 105). In alternate embodiments, the transducer array 210 may be a plurality of speakers that are separate from the wearable device (e.g., coupled to an external console).

The sensor array 220 detects sounds within a local area surrounding the sensor array 220. The sensor array 220 may include a plurality of acoustic sensors that each detect air pressure variations of a sound wave and convert the detected sounds into an electronic format (analog or digital). The plurality of acoustic sensors may be positioned on a headset (e.g., headset 100 and/or the headset 105), on a user (e.g., in an ear canal of the user), on a neckband, or some combination thereof. An acoustic sensor may be, e.g., a microphone, a vibration sensor, an accelerometer, or any combination thereof. In some embodiments, the sensor array 220 is configured to monitor the audio content generated by the transducer array 210 using at least some of the plurality of acoustic sensors. Increasing the number of sensors may improve the accuracy of information (e.g., directionality) describing a sound field produced by the transducer array 210 and/or sound from the local area. In some embodiments, at least one sensor of the sensor array 220 can be implemented as a non-invasive electrode or an implant within a tissue of the user configured to sense firings of neurons when mechano-receptors are active. Such implemented sensor(s) of the sensor array 220 can detect a tactile sensation of the user without any manual feedback from the user.

The audio controller 230 controls operation of the audio system 200. In the embodiment of FIG. 2A, the audio controller 230 includes a data store 235, a DOA estimation module 240, a transfer function module 250, a tracking module 260, a beamforming module 270, a sound filter module 280, and a tactility control module 285. The audio controller 230 may be located inside a headset, in some embodiments. Some embodiments of the audio controller 230 have different components than those described here. Similarly, functions can be distributed among the components in different manners than described here. For example, some functions of the controller may be performed external to the headset.

The data store 235 stores data for use by the audio system 200. Data in the data store 235 may include sounds recorded in the local area of the audio system 200, content (i.e., audio content, tactile content, or combination thereof), head-related transfer functions (HRTFs), transfer functions for one or more sensors, array transfer functions (ATFs) for one or more of the acoustic sensors, sound source locations, virtual model of local area, direction of arrival estimates, sound filters, one or more perception models, actuation parameters, and other data relevant for use by the audio system 200, or any combination thereof.

A perception model stored in the data store 235 may be used, e.g., by the tactility control module 285, for adjusting a level of tactile content when presenting content to a user via the transducer array 210. A perception model may include information about a tactility threshold level for at least one actuation parameter (e.g., an input voltage, an input current, etc.) as a function of a frequency (or a frequency band) for actuating one or more transducers in the transducer array 210. Values of the actuation parameter below the threshold level for the frequency band correspond to ranges of actuation where a portion of the tactile content for the frequency band is not perceived by the user, and values at or above the threshold level correspond to ranges where the portion of the tactile content is perceived by the user. Each perception model in the data store 235 may be unique for a specific user and/or a specific acoustic environment (e.g., indoor environment, outdoor environment, an empty room, an occupied room, etc.). Alternatively, a single perception model in the data store 235 may be common for multiple users and/or multiple acoustic environments. In some embodiments, a perception model in the data store 235 may be obtained, e.g., by the tactility control module 285, by performing calibration of the transducer array 210 for a specific user and/or a specific acoustic environment where the audio system 200 is located.

The DOA estimation module 240 is configured to localize sound sources in the local area based in part on information from the sensor array 220. Localization is a process of determining where sound sources are located relative to the user of the audio system 200. The DOA estimation module 240 performs a DOA analysis to localize one or more sound sources within the local area. The DOA analysis may include analyzing the intensity, spectra, and/or arrival time of each sound at the sensor array 220 to determine the direction from which the sounds originated. In some cases, the DOA analysis may include any suitable algorithm for analyzing a surrounding acoustic environment in which the audio system 200 is located.

For example, the DOA analysis may be designed to receive input signals from the sensor array 220 and apply digital signal processing algorithms to the input signals to estimate a direction of arrival. These algorithms may include, for example, delay and sum algorithms where the input signal is sampled, and the resulting weighted and delayed versions of the sampled signal are averaged together to determine a DOA. A least mean squared (LMS) algorithm may also be implemented to create an adaptive filter. This adaptive filter may then be used to identify differences in signal intensity, for example, or differences in time of arrival. These differences may then be used to estimate the DOA. In another embodiment, the DOA may be determined by converting the input signals into the frequency domain and selecting specific bins within the time-frequency (TF) domain to process. Each selected TF bin may be processed to determine whether that bin includes a portion of the audio spectrum with a direct path audio signal. Those bins having a portion of the direct-path signal may then be analyzed to identify the angle at which the sensor array 220 received the direct-path audio signal. The determined angle may then be used to identify the DOA for the received input signal. Other algorithms not listed above may also be used alone or in combination with the above algorithms to determine DOA.

In some embodiments, the DOA estimation module 240 may also determine the DOA with respect to an absolute position of the audio system 200 within the local area. The position of the sensor array 220 may be received from an external system (e.g., some other component of a headset, an artificial reality console, a mapping server, a position sensor (e.g., the position sensor 190), etc.). The external system may create a virtual model of the local area, in which the local area and the position of the audio system 200 are mapped. The received position information may include a location and/or an orientation of some or all of the audio system 200 (e.g., of the sensor array 220). The DOA estimation module 240 may update the estimated DOA based on the received position information.

The transfer function module 250 is configured to generate one or more acoustic transfer functions. Generally, a transfer function is a mathematical function giving a corresponding output value for each possible input value. Based on parameters of the detected sounds, the transfer function module 250 generates one or more acoustic transfer functions associated with the audio system. The acoustic transfer functions may be array transfer functions (ATFs), head-related transfer functions (HRTFs), other types of acoustic transfer functions, or some combination thereof. An ATF characterizes how the microphone receives a sound from a point in space.

An ATF includes a number of transfer functions that characterize a relationship between the sounds and the corresponding sound received by the acoustic sensors in the sensor array 220. Accordingly, for a sound source there is a corresponding transfer function for each of the acoustic sensors in the sensor array 220. And collectively the set of transfer functions is referred to as an ATF. Note that the sound source may be, e.g., someone or something generating sound in the local area, the user, or one or more transducers of the transducer array 210. The ATF for a particular sound source location relative to the sensor array 220 may differ from user to user due to a person's anatomy (e.g., ear shape, shoulders, etc.) that affects the sound as it travels to the person's ears. Accordingly, the ATFs of the sensor array 220 are personalized for each user of the audio system 200.

In some embodiments, the transfer function module 250 determines one or more HRTFs for a user of the audio system 200. The HRTF characterizes how an ear receives a sound from a point in space. The HRTF for a particular source location relative to a person is unique to each ear of the person (and is unique to the person) due to the person's anatomy (e.g., ear shape, shoulders, etc.) that affects the sound as it travels to the person's ears. In some embodiments, the transfer function module 250 may determine HRTFs for the user using a calibration process. In some embodiments, the transfer function module 250 may provide information about the user to a remote system. The remote system determines a set of HRTFs that are customized to the user using, e.g., machine learning, and provides the customized set of HRTFs to the audio system 200.

The tracking module 260 is configured to track locations of one or more sound sources. The tracking module 260 may compare current DOA estimates and compare them with a stored history of previous DOA estimates. In some embodiments, the audio system 200 may recalculate DOA estimates on a periodic schedule, such as once per second, or once per millisecond. The tracking module may compare the current DOA estimates with previous DOA estimates, and in response to a change in a DOA estimate for a sound source, the tracking module 260 may determine that the sound source moved. In some embodiments, the tracking module 260 may detect a change in location based on visual information received from the headset or some other external source. The tracking module 260 may track the movement of one or more sound sources over time. The tracking module 260 may store values for a number of sound sources and a location of each sound source at each point in time. In response to a change in a value of the number or locations of the sound sources, the tracking module 260 may determine that a sound source moved. The tracking module 260 may calculate an estimate of the localization variance. The localization variance may be used as a confidence level for each determination of a change in movement.

The beamforming module 270 is configured to process one or more ATFs to selectively emphasize sounds from sound sources within a certain area while de-emphasizing sounds from other areas. In analyzing sounds detected by the sensor array 220, the beamforming module 270 may combine information from different acoustic sensors to emphasize sound associated from a particular region of the local area while deemphasizing sound that is from outside of the region. The beamforming module 270 may isolate an audio signal associated with sound from a particular sound source from other sound sources in the local area based on, e.g., different DOA estimates from the DOA estimation module 240 and the tracking module 260. The beamforming module 270 may thus selectively analyze discrete sound sources in the local area. In some embodiments, the beamforming module 270 may enhance a signal from a sound source. For example, the beamforming module 270 may apply sound filters which eliminate signals above, below, or between certain frequencies. Signal enhancement acts to enhance sounds associated with a given identified sound source relative to other sounds detected by the sensor array 220.

The sound filter module 280 determines sound filters for the transducer array 210. In some embodiments, the sound filters cause the audio content to be spatialized, such that the audio content appears to originate from a target region. The sound filter module 280 may use HRTFs and/or acoustic parameters to generate the sound filters. The acoustic parameters describe acoustic properties of the local area. The acoustic parameters may include, e.g., a reverberation time, a reverberation level, a room impulse response, etc. In some embodiments, the sound filter module 280 calculates one or more of the acoustic parameters. In some embodiments, the sound filter module 280 requests the acoustic parameters from a mapping server (e.g., as described below with regard to FIG. 5).

The sound filter module 280 provides the sound filters to the transducer array 210. In some embodiments, the sound filters may cause positive or negative amplification of sounds as a function of frequency.

In some embodiments, the tactility control module 285 controls the transducer array 210 to adjust a level of tactile content imparted to a user via actuation of at least one transducer (e.g., a cartilage conduction transducer) in the transducer array 210 while presenting content to the user via the transducer array 210. The content can include audio content only, tactile content only, or combination of audio content and tactile content. For delivering the audio content only, the tactility control module 285 may adjust an actuation parameter (e.g., an input signal level) of the at least one transducer for a frequency band to be below a tactility threshold level so that a portion of the tactile content for the frequency band is not perceived by the user. Note that values of the actuation parameter below a tactility threshold level correspond to ranges of actuation where a portion of the tactile content for the frequency band is not perceived by the user, and values at or above the tactility threshold level correspond to ranges where the portion of the tactile content is perceived by the user.

In one or more embodiments, the tactility control module 285 adjusts a level of tactile content by applying a fixed actuation threshold approach based on, e.g., a transducer sensitivity. The transducer sensitivity can be defined as a transfer function between an actuation parameter (i.e., a level of an actuating input signal, such as an input voltage) and an output sound pressure for a plurality of frequency bands of sound pressure waves delivered to a user via a transducer. For audio-only content, the frequency bands are typical frequency bands covering a humanly perceived acoustic spectrum, e.g., between approximately 20 Hz and 20,000 Hz. For tactile-only content, the frequency bands are limited to low frequencies, e.g., frequencies below approximately 500 Hz, as mechanoreceptors are primarily sensitive for frequencies below, e.g., 500 Hz. If a sensitivity of a transducer in the transducer array 210 is constant (e.g., over time and across multiple users) over time and across multiple users, the tactility control module 285 may derive a fixed tactility threshold level for an actuation parameter (e.g., an actuation signal) at each defined frequency band of a plurality of frequency bands that, e.g., cover acoustic spectrum perceived by humans. The tactility control module 285 may apply, e.g., a standard dynamic range compression scheme to ensure that a level of actuation parameter for actuation of the at least one transducer in the transducer array 210 is below a derived tactility threshold level to avoid tactility sensation for a specific frequency band associated with the derived tactility threshold level.

In some embodiments, the sensor array 220 detects sounds (i.e., content including audio/tactile) produced by the transducer array 210 when at least one transducer in the transducer array 210 is actuated via an actuation parameter having a set of initial values for a set of frequency bands. The tactility control module 285 may derive a tactility threshold level for the actuation parameter for each frequency band in the set, based on a portion of the detected sounds within the frequency band. The portion of the detected content within the frequency band may include a certain amount of tactility content that may be larger or smaller than a minimum level of tactile content that is sufficient to be perceived by the user for the frequency band (e.g., depending on an initial value of the actuation parameter for the frequency band and user's perception). The tactility control module 285 may determine the tactility threshold level for the actuation parameter for the frequency band such that a portion of content produced by the transducer array 210 for the frequency band includes approximately the minimum level of tactile content, e.g., by adjusting a level of the actuation parameter relative to the initial value of the actuation parameter for the frequency band. The tactility control module 285 may then adjust the actuation parameter relative to the tactility threshold level when actuating the at least one transducer while presenting the content (i.e., audio only, tactile only, or combination of audio and tactile) to the user. When the actuation parameter is at or above the tactility threshold level, a portion of tactile content for the frequency band is perceived by the user. Otherwise, if the actuation parameter is below the tactility threshold level, a portion of the tactile content for the frequency band is not perceived by the user.

The tactility control module 285 may adjust a level of tactile content by adjusting an actuation parameter of at least one transducer for a frequency band relative to a tactility threshold level by using a perception model from the data store 235. The perception model may be common for a plurality of users and/or acoustic environments. Alternatively, each perception model in the data store 235 may be unique for each user and/or acoustic environment. Alternatively, a perception model may be unique for a specific group of people, e.g., one perception model may be suitable for elderly people and another perception model may be suitable for younger people. The tactility control module 285 may generate a perception model for a particular user and/or acoustic environment by calibrating the at least one transducer in the transducer array 210. During the calibration, the tactility control module 285 determines tactility threshold levels for a plurality of frequency bands based on feedback responses from a user about a perceived level of tactile content for each of the frequency bands. For example, the user may be located in a particular acoustic environment for which a perception model is generated. In one or more embodiments, instead of relying on user's manual feedback about the perceived tactile content, tactility sensation can be automatically detected by one or more sensors of the sensor array 220 implemented as, e.g., non-invasive electrodes and/or implants within a tissue of the user able to sense firings of user's neurons.

In some embodiments, the tactility control module 285 estimates a level of sensitivity of least one transducer in the transducer array 210 for a user, based on a portion of sounds detected by the sensor array 220 within a frequency band below a defined threshold frequency. The tactility control module 285 may then derive a tactility threshold level for an actuation parameter (e.g., a level of input voltage or some other actuating signal) of at least one transducer for the frequency band, based on the estimated transducer sensitivity for the frequency band. The tactility control module 285 adjusts the actuation parameter, e.g., to be below the tactility threshold level so that a portion of the tactile content for the frequency band is not perceived by the user. Alternatively, the tactility control module 285 adjusts the actuation parameter to be at or above the tactility threshold level so that a specific level of the tactile content for the frequency band is perceived by the user.

This particular approach for adjusting a level of tactile content can be referred to as an adaptive input voltage threshold approach since an input voltage threshold is adjusted based on an estimated transducer sensitivity that can vary, e.g., per user and/or over time. In one or more embodiments when the sensitivity of the at least one transducer in the transducer array 210 varies from one user to another, but not over time, the tactility control module 285 may apply a one-time calibration for each user by utilizing, e.g., an in-ear microphone to measure a transducer sensitivity for a defined frequency band, i.e. a functional relation between an output sound pressure and an input voltage for each frequency band. Based on the measured transducer sensitivity, the tactility control module 285 may then derive a tactility threshold level for an actuation parameter for actuating the at least one transducer to perceive or not a portion of tactile content for a frequency band. If the sensitivity of the at least one transducer in the transducer array 210 varies over time as well, then the tactility control module 285 may be configured to repeat the calibration process a specific number of times during a defined time period to update a tactility threshold level for a specific frequency band.

In one or more other embodiments, instead of the in-ear microphone, certain unique properties of cartilage conduction transducers can be leveraged to perform the calibration using microphones on a frame of glasses, e.g., the acoustic sensors 180 mounted on the frame 110 of FIG. 1A. For example, as discussed, one or more transducers in the transducer array 210 can be implemented as cartilage conduction transducers. The tactility sensation typically occurs in low frequency bands. If a cartilage conduction transducer has a good contact with e.g., an auricular cartilage of the user's ear, the radiation pattern of acoustic pressure waves in the air is mainly directional. However, if there is no direct contact between the cartilage conduction transducer and the auricular cartilage, the radiation pattern of acoustic pressure waves in the air may be rather omni-directional. Therefore, the tactility control module 285 may be able to estimate the transducer sensitivity in the low frequency bands by comparing signals from microphones (e.g., the acoustic sensors 180) on both sides of the cartilage conduction transducer of the transducer array 210.

In some embodiments, instead of the sensitivity based calibration, the tactility control module 285 may be configured to measure the input signal threshold curve for a range of frequencies based on a user's feedback on tactility sensation at a different input signal (e.g., voltage). Instead of the user's manual feedback, a tactility sensation can be detected by one or more sensors of the sensor array 220 that are implemented as, e.g., non-invasive electrodes and/or implants within a tissue of the user and configured to sense firings of neurons when mechano-receptors are active. The tactility control module 285 may derive a tactility threshold level for an actuation parameter of at least one transducer in the transducer array 210 for the range of frequencies, based on the tactility sensations detected at the user. The tactility control module 285 may adjust the actuation parameter for the at least one transducer to be below the threshold level so that at least a portion of the tactile content is not perceived by the user.

In some embodiments, at least one sensor (e.g., a microphone and/or accelerometer) of the sensor array 220 monitors a sound pressure and/or an acceleration generated by at least one transducer in the transducer array 210 when presenting an audio signal to a user. The tactility control module 285 may then control the audio content presented to the user based on the at least one or both of the sound pressure and the acceleration such that an amplitude of the audio content for a specific frequency is below a threshold level. Values of the amplitude below the (tactility) threshold level correspond to the audio content where a portion of the tactile content for the frequency is not perceived by the user, and values at or above the threshold level correspond to the audio content where the portion of the tactile content is perceived by the user. Thus, in such case, the tactility control module 285 along with the sensor array 220 performs active control of the transducer array 210 for achieving tactile-free audio content. In one embodiment, a threshold level for tactility sensation for a frequency (or a frequency band) can be obtained from, e.g., a user study where an average tactility threshold curve is obtained for a group of subjects. In another embodiment, a threshold level for tactility sensation for a frequency (or a frequency band) can be obtained using an application where a user can create its own custom tactility threshold curve, e.g., substantially similar to hearing and audiometer applications.

In accordance with certain embodiments of the present disclosure, one objective of audio system 200 can be to augment audio experiences through tactile stimulation. In the case of the audio system 200 having the transducer array 210 with one or more cartilage conduction transducers at an ear's pinna for delivering audio signals, the one or more cartilage conduction transducers may also produce tactile sensations. The tactile sensations may be a by-product of audio delivery. Alternatively, the tactile sensations may be actively controlled as tactile-only signals, e.g., signals with amplitudes below a defined threshold.

In some embodiments, the tactility control module 285 controls tactile content imparted to a user via actuation of at least one transducer in the transducer array 210 to deliver navigation signals without disrupting vision or interrupting other audio content, e.g., a phone call. The controlled tactile content with navigation information can be only content delivered to a user, or can be delivered along with audio content. In one or more embodiments, a tactile signal applied to at least one cartilage conduction coupled to a corresponding ear of a driver can provide an appropriate navigation instruction. For example, a buzz on the right ear may convey the right turn instruction, a buzz on the left ear may convey the left turn instruction, and a buzz on both ears may convey the "drive straight" instruction. The buzz may be intermittent or continuous. In one embodiment, the buzz may start faint and get stronger as the user moves closer to an intersection where they are supposed to turn. An intermitted buzz (e.g., that faints over time) applied to a corresponding ear may convey information that the user missed a turn. The tactility control module 285 may have information about the user location and moving direction from e.g., a third-party navigation apps available on a user's mobile device. Alternatively, the tactility control module 285 may leverage the location and map from a mapping server, and the mapping server may generate and provide navigation instructions to the tactility control module 285 that appropriately controls tactile content.

In some other embodiments, the tactility control module 285 enhances speech intelligibility by controlling the tactile content presented to a user, e.g., along with audio content. For example, tactile stimuli can be delivered to improve hearing of non-aspirated syllables like 'b' and 'p'. In such cases, the tactile stimuli can be delivered by e.g., vibrotactile interfaces to augment hearing.

In some other embodiments, the actively controlled tactile signals can be used for producing near-field effects. The tactility control module 285 may be configured to generate audio content with a defined level of near field effect by controlling the tactile content. In one embodiment, the tactility control module 285 may control the tactile content to produce the near-field effect as a more realistic percept of a virtual mosquito buzzing around an ear. In another embodiment, the tactility control module 285 may control the tactile content to produce the near-field effect as a breath of someone whispering close to a user's ear, e.g., some other person or a virtual assistant.

Typically, audition (i.e., the act of hearing) is integrated with touch for speech perception. For example, non-aspirated syllables like 'b' are more likely heard as the aspirated 'p' when synchronized with air-puffs on the neck or the wrist. In real-life scenario, tactile stimuli can be delivered by vibrotactile interfaces instead of air-puffs, to augment hearing. In noisy environments, for example, carefully delivered tactile stimuli could be used to improve speech perception. Thus, to deliver a preferred level of the tactile stimuli, the tactility control module 285 may perform the natural language processing (NLP) to decode speech signals the user is attending to. Then, the tactility control module 285 may tune tactile stimuli appropriately based on the decoded speech signals.

In some embodiments, tactile stimuli can be also delivered by devices designed for audition. For example, cartilage and bone conduction transducers in the transducer array 210 may deliver vibrations (e.g., especially at the low-end of the frequency spectrum) that induce tactile sensations. Such parasitic signals can also be exploited to augment speech perception. The tactility control module 285 may control the tactile content for presentation to the user by altering spectral content of specific acoustic signals to increase or reduce the intensity of tactile sensations, e.g., to boost the low-end of the spectrum to make 'p' more understandable and reduce it for 'b's. In one or more embodiments, the tactility control module 285 performs the alteration of spectral content based on a perception model stored in, e.g., the data store 235 and generated based at least in part on sounds detected by the sensor array 220.

In one or more other embodiments, the tactility control module 285 controls the tactile content for presentation to the user by enhancing a portion of a frequency spectrum of an audio signal. In the case of head worn AR glasses with contact transducers at the ear (e.g., the tissue transducers 170), signals captured by a microphone array (e.g., the array of acoustic sensors 180) can be used by the tactility control module 285 to reinforce natural sound sources (e.g., another talker) with a defined combination of acoustic and tactile content. Alternatively, the tactility control module 285 may perform selective enhancement of a portion of the frequency spectrum through only one modality (acoustic or tactile) to reinforce natural sound sources.

In some embodiments, the tactility control module 285 enhances a sound source by controlling tactile content, e.g., in telepresence. For example, the tactility control module 285 may control the tactile content to make whispering perceptually more immersive and realistic (even though real whispering may not induce a tactile sensation). The sound source enhanced by the tactility control module 285 may be located at a location remote from the user. The sound source may be a virtual sound source, e.g., a virtual assistant on a user's shoulder or a virtual flying insect. Alternatively, the sound sources may be abstract, such as tactile buzzing for providing directional information to the user.

In some embodiments, the tactility control module 285 performs tactile enhancement on an audio signal to generate audio content with tactile content for presentation to the user. First, an acoustic signal may be recorded (e.g., by the sensor array 220) or generated (e.g., by the tactility control module 285). After that, the tactility control module 285 may process the acoustic signal for tactile enhancement, by applying, e.g., speech segmentation, frequency selective filtering, feature extraction, some other processing technique, or combination thereof. The tactility control module 285 may then create tactile stimuli based on the processed acoustic signal. Alternatively, the tactility control module 285 may filter an audio signal to produce tactile sensations when audio content is delivered to the user. Tactile signals along with acoustic signals may be delivered via contact transducers of the transducer array 210 located near an ear, e.g., by a cartilage conduction transducer coupled to a tragus or pinna, or by a bone conduction transducer.

In some embodiments, the sensor array 220 detect sounds produced by at least one transducer (e.g., cartilage conduction transducer) in the transducer array 210 when presenting the audio content to the user. The tactility control module 285 may detect a level of degradation of the detected sounds, e.g., due to cartilage conduction of acoustic pressure waves. The tactility control module 285 may then process an audio signal to mitigate degradation of acoustic content in the audio signal, based on the detected level of degradation. In some embodiments, the tactility control module 285 performs machine learning on the detected sounds to train a classifier. The tactility control module 285 may apply the trained classifier to classify the detected sounds into different classes (i.e., different types of degradation), based on types and features of the detected sounds. The tactility control module 285 may also alert the user if a particular type of degradation is above a threshold level.

Figure 2B:
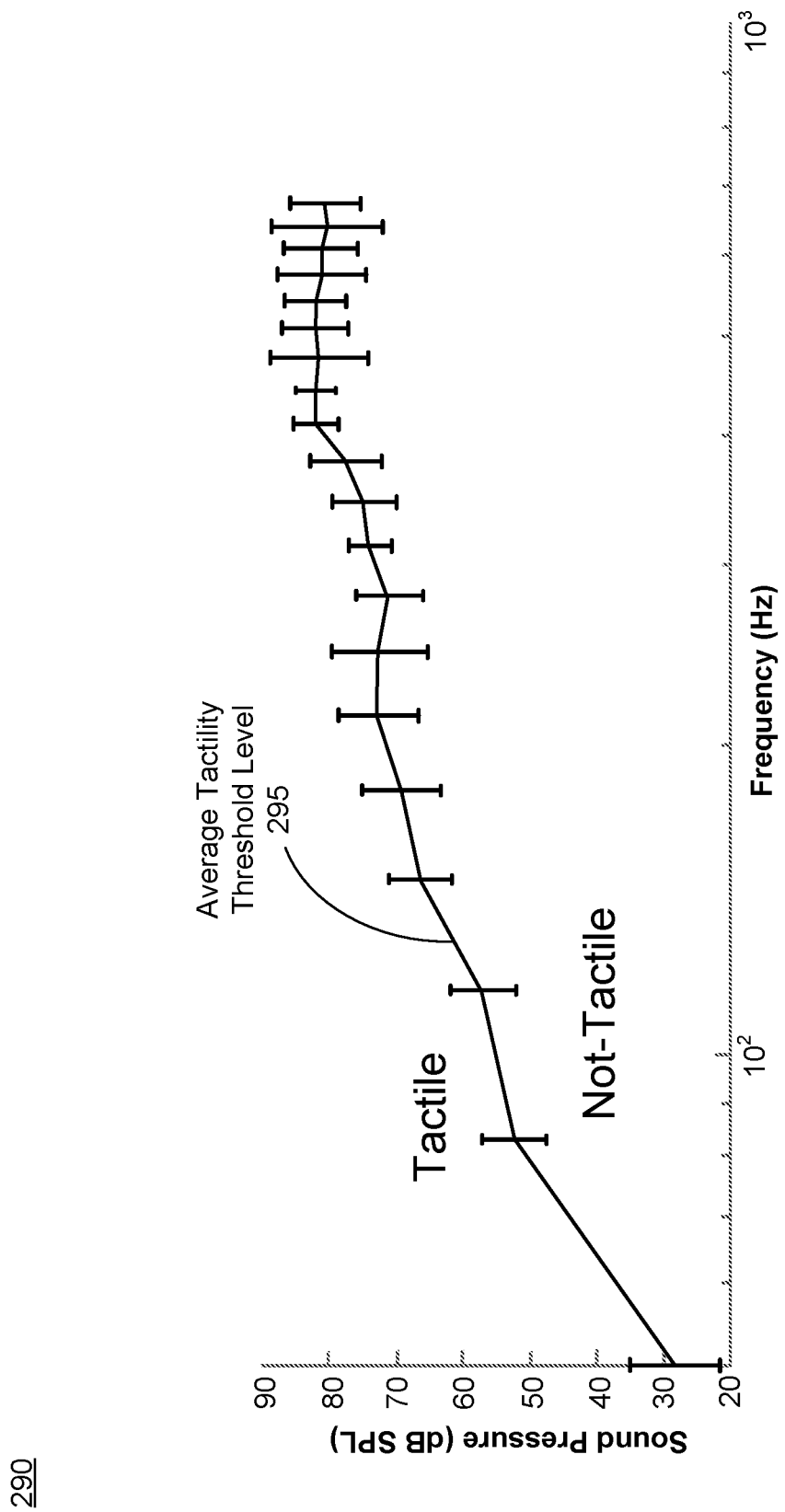
FIG. 2B is an example graph illustrating a tactility threshold level for actuation of a transducer in the audio system of FIG. 2A as a function of frequency, in accordance with one or more embodiments.

FIG. 2B is an example graph 290 illustrating an average tactility threshold level for a transducer of, e.g., the transducer array 210 in the audio system 200 as a function of a frequency, in accordance with one or more embodiments. A curve 295 shown in FIG. 2B represents an average tactility threshold level (e.g., represented as a sound pressure level (SPL)) as a function of a frequency of tactile content. The graph 290 shows threshold levels for both audibility and tactile sensation of presented content. Values of the SPL below the curve 295 correspond to cases when a portion of the tactile content for a specific frequency is not perceived by an "average user." Values of the SPL at or above the curve 295 correspond to cases when the portion of the tactile content is perceived by the "average user." For example, the graph 290 shows that at 200 Hz, if the SPL created by a cartilage conduction transducer is above approximately 80 dB, the "average user" perceives both audio and tactile simultaneously, i.e., the user not only hears but also feels sensations.

The tactility threshold curve 295 is based on tactility threshold data collected for a group of users by averaging tactility thresholds for the group of users. In the illustrated embodiment, the tactility threshold data represented by dB levels of SPL are obtained using a specific (e.g., custom-made) cartilage conduction transducer placed at a same location on an ear of each user. And an excitation level for the cartilage conduction transducer is incrementally increased until the perceived audio becomes bi-modal, i.e., includes audio content and tactile content. Note that different tactility threshold curves from that of FIG. 2B can be generated by utilizing different cartilage conduction transducers based on, e.g., amounts of energies transmitted to the skin of each user and to the air. In addition, the relationship between the SPL and tactility sensations may vary when the SPL is measured using different transducer devices.

The tactility threshold curve 295 of FIG. 2B shows that, at lower frequencies, there is a higher probability of being in a tactile domain than for higher frequencies. The tactility threshold data shown in the graph 290 are obtained using, e.g., a microphone placed at an entrance to an ear-canal. A similar threshold curve can be obtained if an accelerometer in contact with pinna us used. In such case, the tactility threshold data would represent acceleration thresholds for when the content can be both heard and felt. Note that the acceleration threshold can be converted to information about a velocity (e.g., by integration) or to information about a tissue displacement (e.g., by double integration). In other embodiments (not shown in FIG. 2B), similar curves may be obtained for bone conduction and air conduction.

Figure 3:
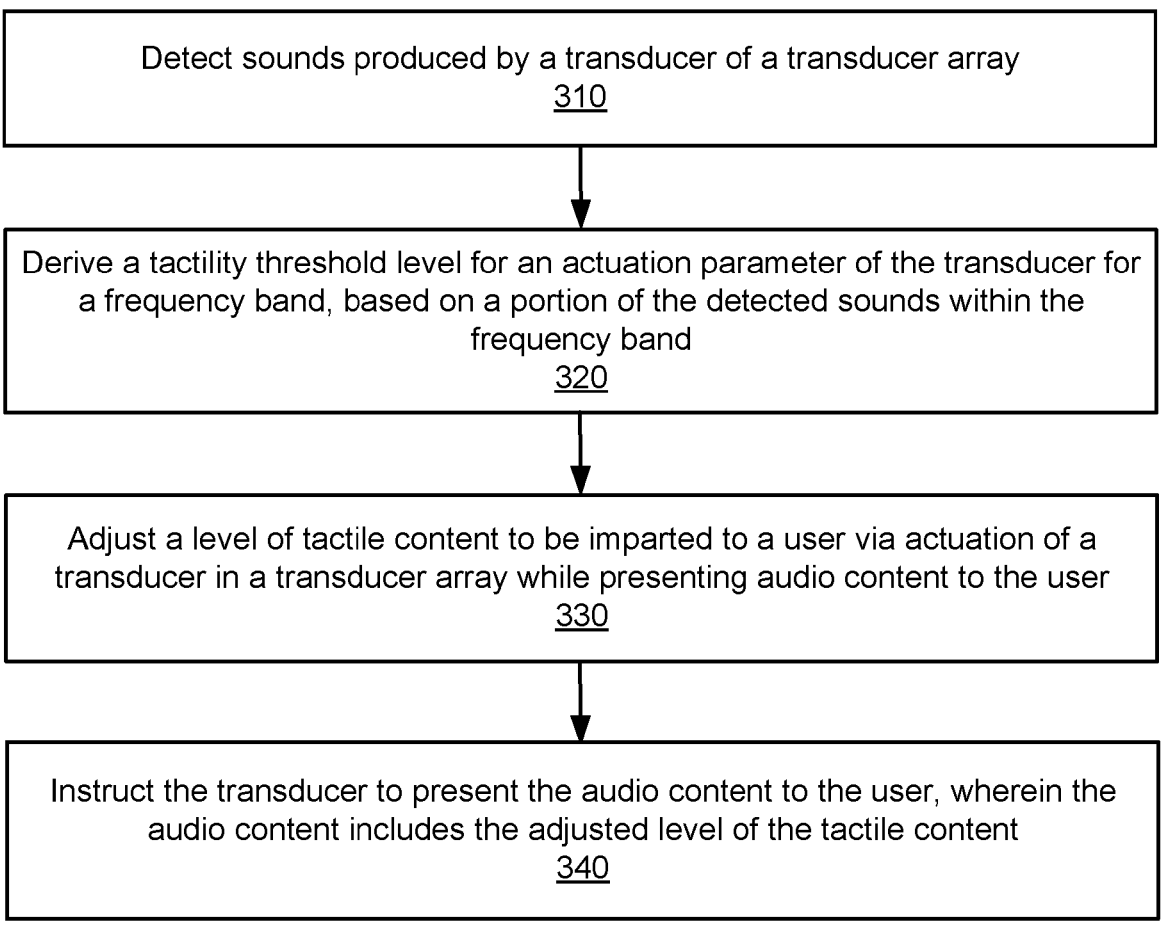
FIG. 3 is a flowchart illustrating a process for adjusting a level of tactile content while presenting audio content, in accordance with one or more embodiments.

FIG. 3 is a flowchart of a method 300 for adjusting a level of tactile content while presenting audio content, in accordance with one or more embodiments. The process shown in FIG. 3 may be performed by components of an audio system (e.g., the audio system 200). Other entities may perform some or all of the steps in FIG. 3 in other embodiments. Embodiments may include different and/or additional steps, or perform the steps in different orders. The audio system may be part of a headset.

The audio system detects 310 (e.g., via the sensor array 220) sounds produced by a transducer of a transducer array. The audio system may detect a tactility sensation within a tissue of the user, e.g., via one or more sensors coupled to the tissue or positioned in the tissue. Alternatively or additionally, the audio system may monitor a sound pressure and/or an acceleration generated by the transducer when presenting audio to the user. The audio system may control the audio presented to the user based on the monitored sound pressure and/or acceleration such that an amplitude of the audio content for a defined frequency is below a tactility threshold level. Values of the amplitude below the threshold level correspond to the audio where a portion of the tactile content for the frequency is not perceived by the user, and values at or above the threshold level correspond to the audio where the portion of the tactile content is perceived by the user.

The audio system derives 320 a tactility threshold level for an actuation parameter of the transducer for a frequency band, based on a portion of the detected sounds within the frequency band. Values of the actuation parameter below the tactility threshold level correspond to ranges of actuation where a portion of the tactile content for the frequency band is not perceived by the user and values at or above the threshold level correspond to ranges where the portion of the tactile content is perceived by the user. In some embodiments, the audio system estimates a level of sensitivity of the transducer for the user, based on the portion of the detected sounds in a frequency band below a defined threshold frequency. The audio system derives the threshold level for the actuation parameter, based on the estimated level of sensitivity. In some other embodiments, the audio system derives the threshold level for the actuation parameter, based on a tactility sensation detected, e.g., by one or more sensors of the sensor array 220 located within the tissue of the user.

In some embodiments, based on detected tactility sensations for a particular user and/or acoustic environment for a plurality of frequency bands of delivered tactile content, the audio system is calibrated to generate a perception model. The perception model may include information about a tactility threshold level for an actuation parameter (e.g., input voltage) as a function of a frequency band (or frequency) for actuating the transducer. The perception model may be identical for a plurality of users and/or a plurality of acoustic environments. Alternatively, the perception model may be unique for a particular user and/or a particular acoustic environment.

The audio system adjusts 330 (e.g., via the tactility control module 285) a level of tactile content to be imparted to a user via actuation of a transducer in a transducer array while presenting audio content to the user. The audio system may adjust the level of tactile content by adjusting an actuation parameter (i.e., a level of actuation signal such as a voltage or current) of the transducer relative to a tactility threshold level for a specific frequency band. In some embodiments, the audio system adjusts the actuation parameter to be below the tactility threshold level when actuating the transducer so that a portion of the tactile content for the specific frequency band is not perceived by the user. The audio system may adjust the level of tactile content based on the perception model.

The audio system instructs 340 the transducer to present the audio content to the user, wherein the audio content includes the adjusted level of the tactile content. The audio system (e.g., the tactility control module 285) may apply a level of actuation parameter (e.g., an input voltage level) for a frequency band to an actuator of the transducer that is below a tactility threshold level for the frequency band so that the user does not perceive any tactile sensation for the frequency band.

Figure 4:
FIG. 4 is a flowchart illustrating a process for controlling tactile content presented to a user, in accordance with one or more embodiments.

FIG. 4 is a flowchart of a method 400 for controlling tactile content presented to a user, in accordance with one or more embodiments. The process shown in FIG. 4 may be performed by components of an audio system (e.g., the audio system 200). Other entities may perform some or all of the steps in FIG. 4 in other embodiments. Embodiments may include different and/or additional steps, or perform the steps in different orders. The audio system may be part of a headset.

The audio system controls 410 (e.g., via the tactility control module 285) an amount of tactile content to be imparted to a user via actuation of at least one transducer in a transducer array while presenting audio content to the user. The audio system may provide navigation information by using the controlled tactile content. Furthermore, the audio system may increase speech intelligibility for the audio content presented to the user by controlling the amount of the tactile content within the presented audio content. Alternatively or additionally, the audio system may generate the audio content with a defined level of near field effect by controlling the amount of the tactile content within the presented audio content.

In some embodiments, the audio system controls the amount of the tactile content when generating the audio content by altering spectral content of an input audio signal, based on a perception model (e.g., stored at the data store 235). The audio system may detect (e.g., via a sensor array) sounds produced by the transducer array. The audio system may input information about the detected sounds into the perception model to adjust a level of tactile content. In some other embodiments, the audio system controls the tactile content by enhancing a portion of a frequency spectrum of an audio signal when generating the audio content for presentation to the user. In yet some other embodiments, the audio system enhances a sound source by controlling the tactile content, wherein the sound source (e.g., the virtual sound source) is located at a location remotely from the user.

In some embodiments, the audio controller performs tactile enhancement on an input audio signal to create the audio content with the tactile content for presentation to the user. In some other embodiments, the audio system detects (e.g., via a sensor array) sounds produced by the transducer array that includes at least one cartilage conduction transducer. The audio system may detect a level of degradation of the detected sounds, e.g., due to cartilage conduction of acoustic pressure waves. The audio system may process an audio signal to mitigate degradation of an acoustic content in the audio content for presentation to the user, based on the detected level of degradation.

The audio system instructs 420 the transducer array to present the audio content to the user, wherein the audio content includes the tactile content. In some embodiments, the audio system provides navigation instructions to the user using the tactile content. The transducer array may include a plurality of cartilage conduction transducers, wherein at least one of the cartilage conduction transducers is attached to a corresponding ear of the user. The audio system applies the tactile content to the corresponding ear via the at least one cartilage conduction transducer to provide, e.g., the navigation instructions to the user.

System Environment

Figure 5:
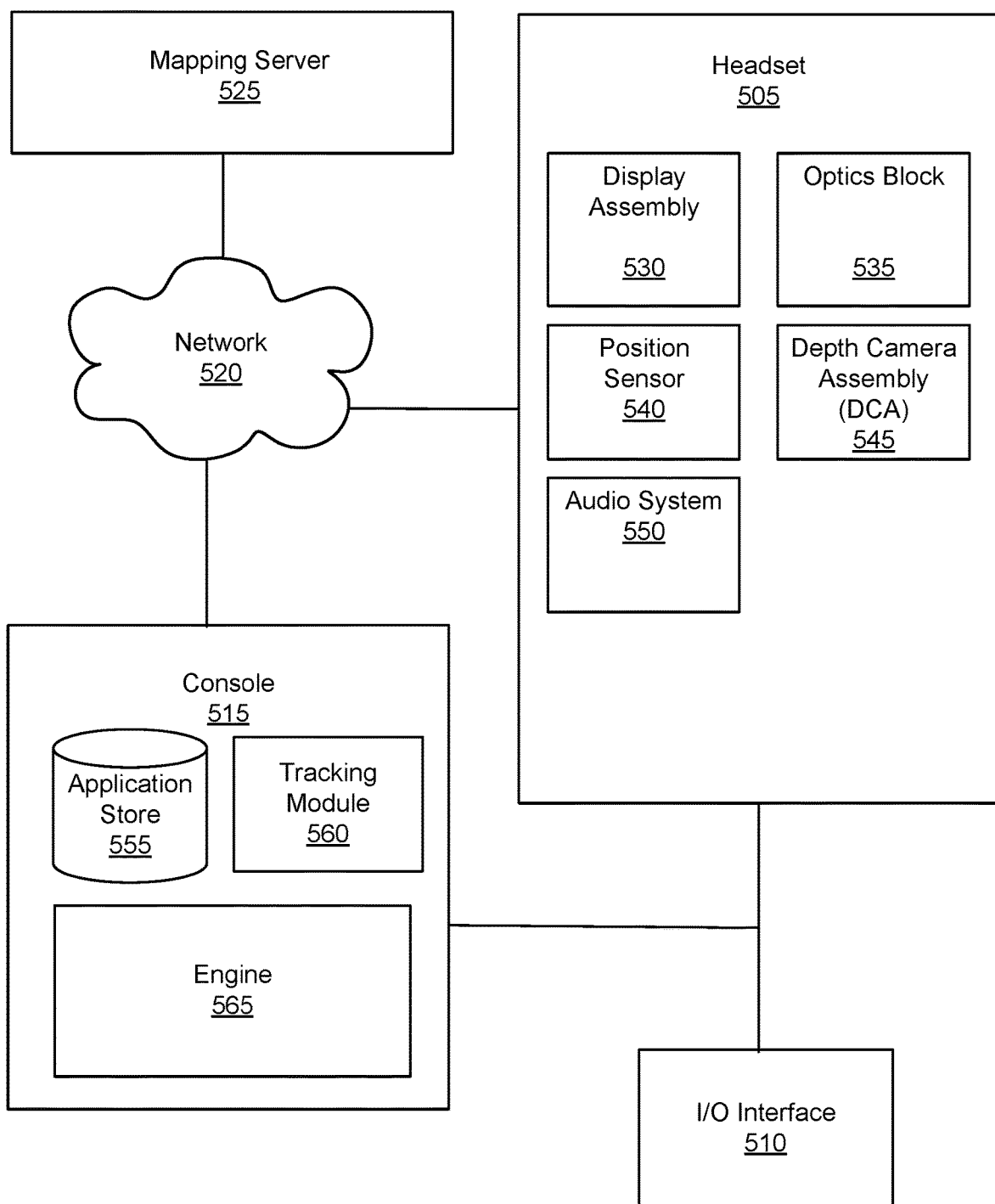
FIG. 5 is a system that includes a headset, in accordance with one or more embodiments.

FIG. 5 is a system 500 that includes a headset 505, in accordance with one or more embodiments. In some embodiments, the headset 505 may be the headset 100 of FIG. 1A or the headset 105 of FIG. 1B. The system 500 may operate in an artificial reality environment (e.g., a virtual reality environment, an augmented reality environment, a mixed reality environment, or some combination thereof). The system 500 shown by FIG. 5 includes the headset 505, an input/output (I/O) interface 510 that is coupled to a console 515, a network 520, and a mapping server 525. While FIG. 5 shows an example system 500 including one headset 505 and one I/O interface 510, in other embodiments any number of these components may be included in the system 500. For example, there may be multiple headsets each having an associated I/O interface 510, with each headset and I/O interface 510 communicating with the console 515. In alternative configurations, different and/or additional components may be included in the system 500. Additionally, functionality described in conjunction with one or more of the components shown in FIG. 5 may be distributed among the components in a different manner than described in conjunction with FIG. 5 in some embodiments. For example, some or all of the functionality of the console 515 may be provided by the headset 505.

The headset 505 includes the display assembly 530, an optics block 535, one or more position sensors 540, and the DCA 545. Some embodiments of headset 505 have different components than those described in conjunction with FIG. 5. Additionally, the functionality provided by various components described in conjunction with FIG. 5 may be differently distributed among the components of the headset 505 in other embodiments, or be captured in separate assemblies remote from the headset 505.

The display assembly 530 displays content to the user in accordance with data received from the console 515. The display assembly 530 displays the content using one or more display elements (e.g., the display elements 120). A display element may be, e.g., an electronic display. In various embodiments, the display assembly 530 comprises a single display element or multiple display elements (e.g., a display for each eye of a user). Examples of an electronic display include: a liquid crystal display (LCD), an organic light emitting diode (OLED) display, an active-matrix organic light-emitting diode display (AMOLED), a waveguide display, some other display, or some combination thereof. Note in some embodiments, the display element 120 may also include some or all of the functionality of the optics block 535.

The optics block 535 may magnify image light received from the electronic display, corrects optical errors associated with the image light, and presents the corrected image light to one or both eyeboxes of the headset 505. In various embodiments, the optics block 535 includes one or more optical elements. Example optical elements included in the optics block 535 include: an aperture, a Fresnel lens, a convex lens, a concave lens, a filter, a reflecting surface, or any other suitable optical element that affects image light. Moreover, the optics block 535 may include combinations of different optical elements. In some embodiments, one or more of the optical elements in the optics block 535 may have one or more coatings, such as partially reflective or anti-reflective coatings.

Magnification and focusing of the image light by the optics block 535 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 110 degrees diagonal), and in some cases all, of the user's field of view. Additionally, in some embodiments, the amount of magnification may be adjusted by adding or removing optical elements.

In some embodiments, the optics block 535 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 535 corrects the distortion when it receives image light from the electronic display generated based on the content.

The position sensor 540 is an electronic device that generates data indicating a position of the headset 505. The position sensor 540 generates one or more measurement signals in response to motion of the headset 505. The position sensor 190 is an embodiment of the position sensor 540. Examples of a position sensor 540 include: one or more IMUS, one or more accelerometers, one or more gyroscopes, one or more magnetometers, another suitable type of sensor that detects motion, or some combination thereof. The position sensor 540 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 505 from the sampled data. For example, the IMU integrates the measurement signals received from the accelerometers over time to estimate a velocity vector and integrates the velocity vector over time to determine an estimated position of a reference point on the headset 505. The reference point is a point that may be used to describe the position of the headset 505. While the reference point may generally be defined as a point in space, however, in practice the reference point is defined as a point within the headset 505.

The DCA 545 generates depth information for a portion of the local area. The DCA includes one or more imaging devices and a DCA controller. The DCA 545 may also include an illuminator. Operation and structure of the DCA 545 is described above with regard to FIG. 1A.

The audio system 550 provides audio content to a user of the headset 505. The audio system 550 is substantially the same as the audio system 200 describe above. The audio system 550 may comprise one or acoustic sensors, one or more transducers, and an audio controller. The audio system 550 may provide spatialized audio content to the user. In some embodiments, the audio system 550 may request acoustic parameters from the mapping server 525 over the network 520. The acoustic parameters describe one or more acoustic properties (e.g., room impulse response, a reverberation time, a reverberation level, etc.) of the local area. The audio system 550 may also request navigation instructions from the mapping server 525. For example, a user wearing the headset 505 may provide destination information, and the mapping server 525 may generate navigation instructions using user location, provided destination, and a model of area. The audio system 550 may provide information describing at least a portion of the local area from e.g., the DCA 545 and/or location information for the headset 505 from the position sensor 540. The audio system 550 may generate one or more sound filters using one or more of the acoustic parameters received from the mapping server 525, and use the sound filters to provide audio content to the user.

In some embodiments, the audio system 550 controls one or more transducers to adjust a level of tactile content imparted to the user via actuation of the one or more transducers, e.g., while presenting the audio content to the user. The audio system 550 may adjust the level of tactile content by adjusting an actuation parameter of the one or more transducers for a frequency band relative to a threshold level. Values of the actuation parameter below the threshold level correspond to ranges of actuation where a portion of the tactile content for the frequency band is not perceived by the user, and values at or above the threshold level correspond to ranges where the portion of the tactile content is perceived by the user.

In some other embodiments, the audio system 550 controls tactile content imparted to a user via actuation of at least one transducer in a transducer array. The audio system 550 presents the controlled tactile content to the user, e.g., via the one or more transducers. The audio system 550 may provide navigation instructions to the user using the tactile content, e.g., by applying the tactile content to a corresponding ear of the user via at least one cartilage conduction transducer attached to the ear. The audio system 550 may also increase speech intelligibility for the audio content presented to the user by controlling the tactile content. Alternatively or additionally, the audio system 550 may generate the audio content with a defined level of near field effect by controlling the tactile content.

The I/O interface 510 is a device that allows a user to send action requests and receive responses from the console 515. An action request is a request to perform a particular action. For example, an action request may be an instruction to start or end capture of image or video data, or an instruction to perform a particular action within an application. The I/O interface 510 may include one or more input devices. Example input devices include: a keyboard, a mouse, a game controller, or any other suitable device for receiving action requests and communicating the action requests to the console 515. An action request received by the I/O interface 510 is communicated to the console 515, which performs an action corresponding to the action request. In some embodiments, the I/O interface 510 includes an IMU that captures calibration data indicating an estimated position of the I/O interface 510 relative to an initial position of the I/O interface 510. In some embodiments, the I/O interface 510 may provide haptic feedback to the user in accordance with instructions received from the console 515. For example, haptic feedback is provided when an action request is received, or the console 515 communicates instructions to the I/O interface 510 causing the I/O interface 510 to generate haptic feedback when the console 515 performs an action.

The console 515 provides content to the headset 505 for processing in accordance with information received from one or more of: the DCA 545, the headset 505, and the I/O interface 510. In the example shown in FIG. 5, the console 515 includes an application store 555, a tracking module 560, and an engine 565. Some embodiments of the console 515 have different modules or components than those described in conjunction with FIG. 5. Similarly, the functions further described below may be distributed among components of the console 515 in a different manner than described in conjunction with FIG. 5. In some embodiments, the functionality discussed herein with respect to the console 515 may be implemented in the headset 505, or a remote system.

The application store 555 stores one or more applications for execution by the console 515. An application is a group of instructions, that when executed by a processor, generates content for presentation to the user. Content generated by an application may be in response to inputs received from the user via movement of the headset 505 or the I/O interface 510. Examples of applications include: gaming applications, conferencing applications, video playback applications, or other suitable applications.

The tracking module 560 tracks movements of the headset 505 or of the I/O interface 510 using information from the DCA 545, the one or more position sensors 540, or some combination thereof. For example, the tracking module 560 determines a position of a reference point of the headset 505 in a mapping of a local area based on information from the headset 505. The tracking module 560 may also determine positions of an object or virtual object. Additionally, in some embodiments, the tracking module 560 may use portions of data indicating a position of the headset 505 from the position sensor 540 as well as representations of the local area from the DCA 545 to predict a future location of the headset 505. The tracking module 560 provides the estimated or predicted future position of the headset 505 or the I/O interface 510 to the engine 565.

The engine 565 executes applications and receives position information, acceleration information, velocity information, predicted future positions, or some combination thereof, of the headset 505 from the tracking module 560. Based on the received information, the engine 565 determines content to provide to the headset 505 for presentation to the user. For example, if the received information indicates that the user has looked to the left, the engine 565 generates content for the headset 505 that mirrors the user's movement in a virtual local area or in a local area augmenting the local area with additional content. Additionally, the engine 565 performs an action within an application executing on the console 515 in response to an action request received from the I/O interface 510 and provides feedback to the user that the action was performed. The provided feedback may be visual or audible feedback via the headset 505 or haptic feedback via the I/O interface 510.

The network 520 couples the headset 505 and/or the console 515 to the mapping server 525. The network 520 may include any combination of local area and/or wide area networks using both wireless and/or wired communication systems. For example, the network 520 may include the Internet, as well as mobile telephone networks. In one embodiment, the network 520 uses standard communications technologies and/or protocols. Hence, the network 520 may include links using technologies such as Ethernet, 802.11, worldwide interoperability for microwave access (WiMAX), 2G/3G/4G mobile communications protocols, digital subscriber line (DSL), asynchronous transfer mode (ATM), InfiniBand, PCI Express Advanced Switching, etc. Similarly, the networking protocols used on the network 520 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 520 can be represented using technologies and/or formats including image data in binary form (e.g. Portable Network Graphics (PNG)), hypertext markup language (HTML), extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc.

The mapping server 525 may include a database that stores a virtual model describing a plurality of spaces, wherein one location in the virtual model corresponds to a current configuration of a local area of the headset 505. The mapping server 525 receives, from the headset 505 via the network 520, information describing at least a portion of the local area and/or location information for the local area. The mapping server 525 determines, based on the received information and/or location information, a location in the virtual model that is associated with the local area of the headset 505. The mapping server 525 determines (e.g., retrieves) one or more acoustic parameters associated with the local area, based in part on the determined location in the virtual model and any acoustic parameters associated with the determined location. The mapping server 525 may transmit the location of the local area and any values of acoustic parameters associated with the local area to the headset 505. The mapping server 525 may provide navigation instructions to the audio system 550. The mapping server 525 may generate the navigation instructions using user location, destination provided by the user, and a model of area.

ADDITIONAL CONFIGURATION INFORMATION

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An audio system comprising:
   at least one transducer configured to present audio content to a user; and
   a controller configured to control tactile content for presentation to the user by altering spectral content of specific acoustic signals to adjust an intensity of tactile sensations imparted to the user via actuation of the at least one transducer for improving speech perception by the user in relation to one or more consonant sounds while presenting the audio content to the user.

2. The audio system of claim 1, wherein the controller is further configured to:
   adjust an actuation parameter of the at least one transducer for a frequency band of a spectrum of the audio content to be below a threshold level, wherein values of the actuation parameter below the threshold level correspond to ranges of actuation where a portion of the tactile content for the frequency band is not perceived by the user and values at or above the threshold level correspond to ranges where the portion of the tactile content is perceived by the user.

3. The audio system of claim 2, wherein the actuation parameter is a voltage applied to the at least one transducer for presenting the portion of the tactile content within the frequency band to the user.

4. The audio system of claim 1, wherein the controller is further configured to alter the spectral content using a perception model for the user.

5. The audio system of claim 1, wherein the controller is further configured to:
   generate a perception model for the user by calibrating the at least one transducer; and
   alter the spectral content using the perception model.

6. The audio system of claim 1, further comprising:
   a sensor array configured to detect sounds produced by the at least one transducer; and
   the controller is further configured to:
      derive a threshold level for an actuation parameter of the at least one transducer for a frequency band of a spectrum of the audio content, based on a portion of the detected sounds within the frequency band, and
      adjust the actuation parameter to be below the threshold level when actuating the at least one transducer for presentation of a portion of the tactile content within the frequency band, values of the actuation parameter below the threshold level correspond to ranges of actuation where a portion of the tactile content for the frequency band is not perceived by the user and values at or above the threshold level correspond to ranges where the portion of the tactile content is perceived by the user.

7. The audio system of claim 1, further comprising:
   a sensor array configured to detect sounds produced by the at least one transducer; and
   the controller is further configured to:
      estimate a level of sensitivity of the at least one transducer for the user, based on a portion of the detected sounds in a frequency band of a spectrum of the audio content below a threshold frequency,
      derive a threshold level for an actuation parameter of the at least one transducer for the frequency band, based on the estimated level of sensitivity, and
      adjust the actuation parameter to be below the threshold level, wherein values of the actuation parameter below the threshold level correspond to ranges of actuation where a portion of the tactile content for the frequency band is not perceived by the user and values at or above the threshold level correspond to ranges where the portion of the tactile content is perceived by the user.

8. The audio system of claim 1, further comprising:
   a sensor array configured to detect tactility sensation within a tissue of the user; and
   the controller is further configured to:
      derive a threshold level for an actuation parameter of the at least one transducer for a frequency band of a spectrum of the audio content, based on a portion of the detected tactility sensation, and
      adjust the actuation parameter to be below the threshold level, wherein values of the actuation parameter below the threshold level correspond to ranges of actuation where a portion of the tactile content for the frequency band is not perceived by the user and values at or above the threshold level correspond to ranges where the portion of the tactile content is perceived by the user.

9. The audio system of claim 1, further comprising:
a sensor array configured to monitor at least one of a sound pressure and an acceleration generated by the at least one transducer when presenting an audio signal to the user; and
the controller is further configured to control the audio content presented to the user based on the at least one of the sound pressure and the acceleration such that at least one amplitude of the audio content for at least one frequency of a spectrum of the audio content is below a threshold level,
wherein values of the at least one amplitude below the threshold level correspond to the audio content where a portion of the tactile content is not perceived by the user and values at or above the threshold level correspond to the audio content where the portion of the tactile content is perceived by the user.

10. The audio system of claim 1, wherein the at least one transducer comprises at least one of a bone conduction transducer and a cartilage conduction transducer.

11. The audio system of claim 1, wherein the at least one transducer comprises a plurality of cartilage conduction transducers.

12. The audio system of claim 1, wherein the at least one transducer comprises at least one of: a plurality of air conduction transducers, a plurality of bone conduction transducers, and a plurality of cartilage conduction transducers.

13. The audio system of claim 1, wherein the audio system is part of a headset.

14. A method comprising:
controlling tactile content for presentation to a user by altering spectral content of specific acoustic signals to adjust an intensity of tactile sensations imparted to the user via actuation of at least one transducer for improving speech perception by the user in relation to one or more consonant sounds while presenting audio content to the user; and
instructing the at least one transducer to present the audio content to the user, wherein the audio content includes the adjusted intensity of the tactile sensations.

15. The method of claim 14, further comprising:
adjusting an actuation parameter of the at least one transducer for a frequency band of a spectrum of the audio content to be below a threshold level, wherein values of the actuation parameter below the threshold level correspond to ranges of actuation where a portion of the tactile content for the frequency band is not perceived by the user and values at or above the threshold level correspond to ranges where the portion of the tactile content is perceived by the user.

16. The method of claim 14, further comprising:
generating a perception model for the user by calibrating the at least one transducer; and
altering the spectral content using the perception model.

17. The method of claim 14, further comprising:
detecting sounds produced by the at least one transducer;
deriving a threshold level for an actuation parameter of the at least one transducer for a frequency band of a spectrum of the audio content, based on a portion of the detected sounds within the frequency band; and
adjusting the actuation parameter to be below the threshold level when actuating the at least one transducer for presentation of a portion of the tactile content within the frequency band, values of the actuation parameter below the threshold level correspond to ranges of actuation where a portion of the tactile content for the frequency band is not perceived by the user and values at or above the threshold level correspond to ranges where the portion of the tactile content is perceived by the user.

18. The method of claim 14, further comprising:
detecting sounds produced by the at least one transducer;
estimating a level of sensitivity of the at least one transducer for the user, based on a portion of the detected sounds in a frequency band of a spectrum of the audio content below a threshold frequency;
deriving a threshold level for an actuation parameter of the at least transducer for the frequency band, based on the estimated level of sensitivity; and
adjusting the actuation parameter to be below the threshold level, wherein values of the actuation parameter below the threshold level correspond to ranges of actuation where a portion of the tactile content for the frequency band is not perceived by the user and values at or above the threshold level correspond to ranges where the portion of the tactile content is perceived by the user.

19. The method of claim 14, further comprising:
monitoring at least one of a sound pressure and an acceleration generated by the at least one transducer when presenting an audio signal to the user; and
controlling the audio content presented to the user based on the at least one of the sound pressure and the acceleration such that at least one amplitude level of the audio content for at least one frequency of a spectrum of the audio content is below a threshold level,
wherein values of the at least one amplitude below the threshold level correspond to the audio content where a portion of the tactile content is not perceived by the user and values at or above the threshold level correspond to the audio content where the portion of the tactile content is perceived by the user.

20. A computer program product comprising a non-transitory computer-readable storage medium having instructions encoded thereon that, when executed by one or more processors, cause the one or more processors to:
control tactile content for presentation to a user by altering spectral content of specific acoustic signals to adjust an intensity of tactile sensations imparted to the user via actuation of at least one transducer for improving speech perception by the user in relation to one or more consonant sounds while presenting audio content to the user; and
instruct the at least one transducer to present the audio content to the user, wherein the audio content includes the adjusted intensity of the tactile sensations.

* * * * *